(12) United States Patent
Khosla et al.

(10) Patent No.: US 11,545,853 B2
(45) Date of Patent: Jan. 3, 2023

(54) DC ENCODING ON AC DRIVEN SYSTEMS

(71) Applicants: Aarti Khosla, New Delhi (IN); Sanjeev Khosla, New Delhi (IN)

(72) Inventors: Aarti Khosla, New Delhi (IN); Sanjeev Khosla, New Delhi (IN)

( * ) Notice: Subject to any disclaimer, the term of this patent is extended or adjusted under 35 U.S.C. 154(b) by 0 days.

(21) Appl. No.: 17/062,593

(22) Filed: Oct. 4, 2020

(65) Prior Publication Data

US 2022/0320895 A1    Oct. 6, 2022

(51) Int. Cl.
*H02J 13/00* (2006.01)
*H02J 3/14* (2006.01)
*G01R 19/25* (2006.01)
*H03M 13/00* (2006.01)

(52) U.S. Cl.
CPC .... *H02J 13/00004* (2020.01); *G01R 19/2513* (2013.01); *H02J 3/14* (2013.01); *H03M 13/611* (2013.01)

(58) Field of Classification Search
None
See application file for complete search history.

(56) References Cited

U.S. PATENT DOCUMENTS

| 9,863,824 B1 * | 1/2018 | Su ........................ G01M 5/0008 |
| 2019/0372332 A1 * | 12/2019 | Khosla ................... H01H 71/12 |

FOREIGN PATENT DOCUMENTS

| CN | 217008030 U | * | 7/2022 | |
| DE | 102008054902 B4 | * | 11/2011 | ............. G01K 1/026 |
| JP | 2004508796 A | * | 3/2004 | |
| JP | 7112942 B2 | * | 8/2022 | ........ H02J 13/00009 |

* cited by examiner

*Primary Examiner* — Fekadeselassie Girma

(57) ABSTRACT

The present application relates to AC driven control systems that attains high level of functional integrity at one or more location. The present application discloses an AC driven control system that implements the technique of segregating domains of plurality of AC supply based functions using DC encoding thereby attaining high level of functional integrity of load devices that are being remotely operated.

20 Claims, 8 Drawing Sheets

DC ENCODING ON AC DRIVEN SYSTEMS

CROSS-REFERENCE TO RELATED APPLICATION

This application is related to and claims the benefit of priority to Indian Patent Application No. 201911040200, filed 04 Oct. 2019, which is incorporated herein by reference in its entirety.

FIELD OF THE INVENTION

The present application relates to AC driven control systems that attains high level of functional integrity at one or more location. In particular, the present application relates to AC driven control systems that implements the technique of segregating domains of plurality of AC power supply based functions using DC encoding.

BACKGROUND OF THE INVENTION

Railway signalling systems are described by way of example as an electrical system that feeds AC supply over cables from one location for operating load device(s) located at another location(s). In railway signalling systems, amount of AC leaks due to cable faults across the line and line capacitance, and amount of induced AC from high voltage circuits over cable lengths, can be large enough to lead to variety of problems. For example, a fault across the line may draw the adequate current and power indicating that the load device to be operated is working, whereas the load device may not be working. By way of another example, a line connecting the control point and the load device may have an induced voltage of 110VAC/km in 25kV Locomotive Traction area, which can overlap with 110VAC Lit LED Signal command, and thus may result in un-intended operation of the LED load device.

Further, using AC supply in control systems can have numerous disadvantages such as:
  (i) the connecting medium between control point and the load device may get affected by external factors in a manner that it affects the operation of the load;
  (ii) in AC driven control systems after command signal and AC supply to operate a load device is sent from the control location, and after the load device performs the operation, the load device may be required to send feedback signal to the control location. In such instances, it is customary to provide a first transmission medium for carrying the command signals and the feedback signals while a second transmission medium is used for carrying the AC supply; as attaining segregation between the AC supply, the command signal and the feedback signal is difficult. By way of an example a load device may get the command signal for its operation from the control location through a fiber optic cable, derive the AC supply from a separate pair of conductors (provided between the control location and the load device) and then send feedback signal to the control location through the same optical fiber. The use of fiber optic cable for carrying the command signals and the feedback signals and use of a separate pair of conductors that provides the AC supply to the load significantly increases the cost; and
  (iii) adding a conventional code to the operating power, for example, adding a phase shift keying to the AC supply, may not prove helpful as the code may get effected by the external factors and noise.

Thus, there exists a need to overcome one or more of the aforesaid disadvantages thereby to arrive at AC driven control system that attains high level of functional integrity at one or more locations.

SUMMARY OF THE INVENTION

This summary is provided to introduce a selection of concepts in a simplified format that are further described in the detailed description of the invention. This summary is neither intended to identify key or essential inventive concepts of the invention, and nor is it intended for determining the scope of the invention.

In an aspect, the present application discloses an AC driven control system that implements the technique of segregating domains of plurality of AC supply based functions using DC encoding thereby attaining high level of functional integrity of load devices that are being remotely operated.

By way of a non-limiting embodiment, the present application discloses a source device for providing an AC power to at least one load. The source device comprises an input port for receiving an alternating current and a power supply connection mechanism operably connected to the input port. The power supply connection mechanism is configured to generate coded driving current. The power supply connection mechanism comprises a DC coding circuit connected in series between the AC supply means and the load. The DC coding circuit imparts a first resistance value while conducting a positive half cycle of the alternating current and a second resistance value while conducting a negative half cycle of the alternating current, thereby generating coded driving current. In an embodiment of the invention, the first and the second resistance values are unequal.

By way another non-limiting embodiment, the present invention discloses a load device adapted to be driven by the source device as described above. The load comprises a first set of ports adapted to receive coded driving current. The load further comprises a decoding circuit operably connected to the first set of ports and being adapted to decode the coded driving current and to produce a control command. The load device further comprises a control unit adapted to receive the control command from the decoding circuit and controlling at least one working state of an electrical load based on the control command. In an embodiment of the invention, the coded driving current comprises an alternating current including positive half cycles and negative half cycles, wherein the positive half cycles are offset by a first voltage offset level, the negative half cycles are offset by a second voltage offset level, the first and the second voltage offset levels being unequal.

By way another non-limiting embodiment, the present invention discloses a load device adapted to provide coded feedback signal. The load device comprises an electrical load configured to receive an alternating current and a feedback signal generating unit that comprises a DC coding circuit. The DC coding circuit is adapted to receive the alternating current. The DC coding circuit is adapted to impart a first resistance value while conducting a positive half cycle of the alternating current and a second resistance value while conducting a negative half cycle of the alternating current to thereby generate a coded feedback signal, the first and the second resistance values being unequal.

By way another non-limiting embodiment, the present invention discloses source device for providing an AC power to a load device and for receiving feedback there from. The source device comprises an input port for receiving a coded feedback signal; and a decoding circuit operably connected to the input ports and being adapted to decode the coded feedback signal. In an embodiment of the invention, the coded feedback signal comprises an alternating current including positive half cycles and negative half-cycles, wherein the positive half cycles are offset by a first voltage offset level, the negative half cycles are offset by a second voltage offset level, the first and the second voltage offset levels being unequal.

To further clarify advantages and features of the present invention, a more particular description of the invention will be rendered by reference to specific embodiments thereof, which is illustrated in the appended drawings. It is appreciated that these drawings depict only typical embodiments of the invention and are therefore not to be considered limiting of its scope. The invention will be described and explained with additional specificity and detail with the accompanying drawings.

BRIEF DESCRIPTION OF THE FIGURES

In order that the invention may be readily understood and put into practical effect, reference will now be made to exemplary embodiments as illustrated with reference to the accompanying drawings. The figures together with a detailed description below, are incorporated in and form part of the specification, and serve to further illustrate the embodiments and explain various principles and advantages, in accordance with the present invention where.

Figure 1:
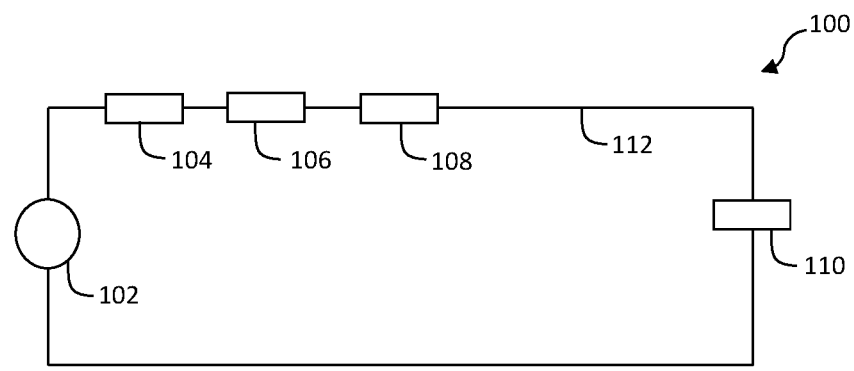
FIG. 1 illustrates block diagram of a system (100) for performing DC encoding on AC driven systems in accordance with an embodiment of the invention.

Further, skilled artisans will appreciate that elements in the drawings are illustrated for simplicity and may not have been necessarily been drawn to scale. For example, in terms of the construction of the device, one or more components of the device may have been represented in the drawings by conventional symbols, and the drawings may show only those specific details that are pertinent to understanding the embodiments of the present invention so as not to obscure the drawings with details that will be readily apparent to those of ordinary skill in the art having benefit of the description herein.

DETAILED DESCRIPTION OF THE INVENTION

For the purpose of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

It will be understood by those skilled in the art that the foregoing general description and the following detailed description are explanatory of the invention and are not intended to be restrictive thereof.

Reference throughout this specification to "an aspect", "another aspect" or similar language means that a particular feature, structure, or characteristic described in connection with the embodiment is included in at least one embodiment of the present invention. Thus, appearances of the phrase "in an embodiment", "in another embodiment" and similar language throughout this specification may, but do not necessarily, all refer to the same embodiment.

The terms "comprises", "comprising", or any other variations thereof, are intended to cover a non-exclusive inclusion, such that a device that comprises a list of components/elements does not include only those components/elements but may include other components/elements not expressly listed or inherent to such device. Similarly, one or more devices or sub-systems or elements or structures or components proceeded by "comprises . . . a" does not, without more constraints, preclude the existence of other devices or other sub-systems or other elements or other structures or other components or additional devices or additional sub-systems or additional elements or additional structures or additional components.

Unless otherwise defined, all technical and scientific terms used herein have the same meaning as commonly understood by one of ordinary skilled in the art to which this invention belongs. The examples provided herein are illustrative only and not intended to be limiting.

Embodiments of the present invention will be described below in detail with reference to the accompanying drawings.

Referring to FIG. 1, there is illustrated a block diagram of a system (100) for performing DC encoding on AC driven systems. By way of a non-limiting example, the system for performing DC encoding on AC driven systems includes a railway signalling system. The system (100) comprises an AC supply unit (102) which is connected to a switch (104). Downstream of the switch 104, a safety fuse unit (106) may be located. A source device (108) for providing an AC power to at least one load device (110) is connected so as to be downstream of the safety fuse unit (106). Cables (112) may be used for connecting the source device (108) to load device (110).

It may be noted that the AC supply unit (102), the switch (104) and the safety fuse unit (106) may be of traditional type and hence, further description of these items is not being provided.

Figure 2:
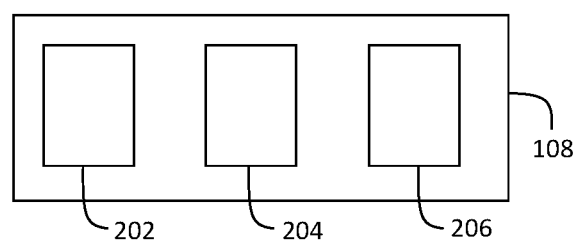
FIG. 2 illustrates block diagram of the source device (108) comprising an input port (202), a power supply connection mechanism (204) and optionally at least one decoding circuit (206) in accordance with an embodiment of the invention.

A detailed view of the source device (108) is shown as FIG. 2. As can be seen from FIG. 2, the source device (108) comprises an input port (202) for receiving an alternating current and a power supply connection mechanism (204) operably connected to the input port. The power supply connection mechanism (204) is configured to generate coded driving current.

In an embodiment of the invention, the source device (108) device may be further adapted to receive coded feedback signal from said at least one load device. In accordance with this embodiment, the source device may further comprise at least one decoding circuit (206) adapted to receive coded feedback signal from said at least one load device and decode the same.

Figure 3:
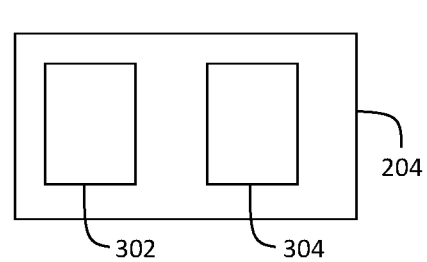
FIG. 3 illustrates block diagram of the power supply connection mechanism (204) comprising a DC coding circuit (302) and optionally a current sensing and validation unit (304) in accordance with an embodiment of the invention.

A detailed view of the power supply connection mechanism (204) is shown as FIG. 3. As can be seen from FIG. 3, the power supply connection mechanism (204) comprises a DC coding circuit (302). The DC coding circuit (302) gets connected in series between the AC supply unit (102) and the load device (110). The power supply connection mechanism (204) may further comprise a current sensing and validation unit (304) connected so as to be downstream of the DC coding circuit (302).

By way of a non-limiting example, the current sensing and validation unit (304) may be used for validating that the current flowing out of the DC coding circuit (302) is within the configured limits. In case the current flowing of the DC coding circuit (302) is not within the configured limits, an error condition may be detected and an error signal may be output. It may be seen that the current flowing out of the DC coding circuit may go outside the configured limits under a variety of conditions such as:

- when the DC coding circuit is not functioning as per the requirement, for example:
  - the output at the DC coding circuit is not AC current but a DC current,
  - the AC current is not DC encoded, etc.
- when the cables (112) used for connecting the source device (108) to load device (110) becomes shorted, etc.
- when devices across the line such as bridge rectifier, filter capacitor/condenser, Surge/Spike arrestor, etc. become leaky or faulty, etc.

The current sensing and validation unit (304) may be of a traditional type and hence, further description about the same is not being provided.

In terms of working, the DC coding circuit (302) generates an alternating waveform pattern (or alternatively a coded driving current) wherein the positive half cycles have a first voltage offset level and the negative half cycles have a second voltage offset level, wherein the first and the second voltage offset levels are also unequal. The difference in the first voltage offset level and the second voltage offset level can be detected from the coded driving current, and therefore can be used as a control command. For example, only upon receiving a pre-agreed coded driving current (i.e. only upon receiving an alternating supply having a pre-agreed difference between the first and the second voltage offset levels or only upon receiving an alternating supply having a pre-agreed first voltage offset level and a pre-agreed second voltage offset level), the load may be switched ON. This aspect of the invention, which is very unique, is being referred to as DC encoding of AC driven systems.

The DC coding circuit (302) generates the coded driving current having the above described characteristics (the positive half cycles having a first voltage offset level and the negative half cycles having a second voltage offset level, wherein the first and the second voltage offset levels are also unequal) by imparting a first resistance value while conducting the positive half cycle of the alternating current and by imparting a second resistance value while conducting a negative half cycle of the alternating current, wherein the first and the second resistance values are unequal.

The DC coding circuit (302) providing the aforesaid functionality may be constructed in a variety of manners. Some the preferred constructions of the DC coding circuit are being described herein after.

Figure 4:
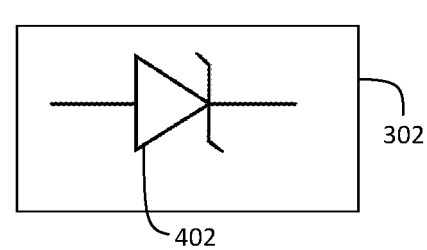
FIG. 4 illustrates block diagram of the DC coding circuit (302) comprising a Zener diode (402) in accordance with an embodiment of the invention.

Referring to FIG. 4, in an embodiment the DC coding circuit (302) comprises a Zener diode (402) which is connected in series between the AC supply means and the load. While the Zener diode (402) conducts under forward bias condition as well as reverse bias condition, it presents a first resistance value in the forward bias condition and presents a second resistance value in the reverse bias condition. Thus, the Zener diode (402) imparts a first resistance value while conducting a positive half cycle of the alternating current and a second resistance value while conducting a negative half cycle of the alternating current, wherein the first and the second resistance values are unequal, thereby generating the coded driving current.

Figure 5:
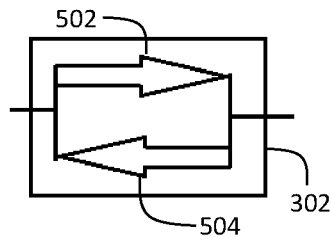
FIG. 5 illustrates block diagram of the DC coding circuit (302) comprising a first path (502) for conducting a positive half cycle of the alternating current and a second path (504) for conducting a negative half cycle of the alternating current in accordance with an embodiment of the invention.

While in the embodiment as described in relation to FIG. 4, the DC coding circuit (302) does not force the positive half cycle of the alternating current and the negative half cycle of the alternating current to flow through two different electrical paths, in an alternative embodiment as shown in FIG. 5, the DC coding circuit (302) defines a first path (502) for conducting a positive half cycle of the alternating current and a second path (504) for conducting a negative half cycle of the alternating current, the first path (502) being parallel to the second path (504). The first path (502) is having a first resistance value and the second path (504) is having a second resistance value, with the first and the second resistance values being unequal. This embodiment is described in detail in the following paragraphs.

Figure 6:
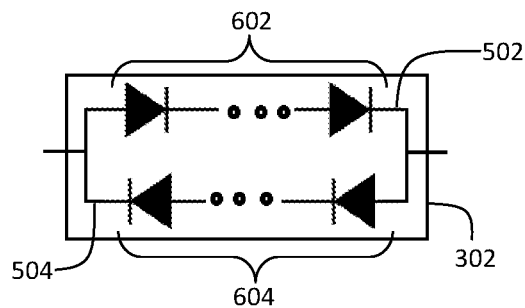
FIG. 6 illustrates block diagram of the DC coding circuit (302) wherein the first path (502) includes a first set of diodes (602) and the second path (504) includes a second set of diodes (604) in accordance with an embodiment of the invention.

Referring particularly to FIG. 6, in one embodiment, the first path (502) includes a first set of diodes (602) and the second path (504) includes a second set of diodes (604), a number of diodes in the first set (602) and the second set (604) are unequal. In an embodiment of the invention both the first and second paths must include more than one diode and a number of diodes in the first path (502) (or in other words, in the first set 602) should be unequal to the number of diodes in the second path (504) (or in other words, in the second set 604). In other words, as shown in FIG. 6, the first set of diodes (602) comprise "x" number of diodes and that the second set of diodes (604) comprise "n" number of diodes, wherein that $x \geq 1$; $n \geq 1$; and $x \neq n$.

Assuming that the first set of diodes (602) are forward biased during the positive half cycle of the alternating current and the second set of diodes (604) are forward biased during the negative half cycle of the alternating current, the DC coding circuit (302) effectively conducts the entire alternating current. Since, each diode possesses a finite resistance when conducting in the forward biased condition, the first path (502) will impart a first resistance value (which is proportionate to the number of diodes in the first set of diodes (602)) to the positive half cycle of the alternating current, and the second path (504) will impart a second resistance value (which is proportionate to the number of diodes in the second set of diodes (604)), thereby generating the coded driving current.

Figure 7:
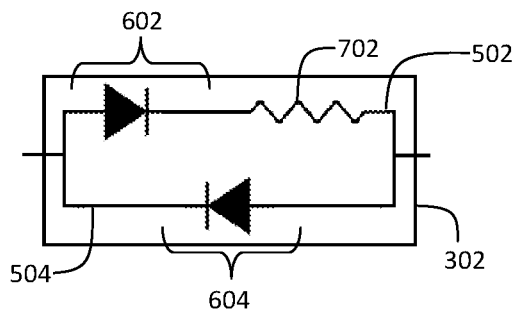
FIG. 7 illustrates block diagram of the DC coding circuit (302) wherein the first path (502) includes a first set of diodes (602) and the second path (504) includes a second set of diodes (604) and wherein the first path (502) is further provided with a resistor (702) in accordance with an embodiment of the invention.

Referring particularly to FIG. 7, in one embodiment, the first path (502) includes a first set of diodes (602) and the second path (504) includes a second set of diodes (604). In an embodiment of the invention, one of the first or the second path is further provided with at least one resistor (702). In this embodiment, the diodes (602 and 604) are placed such that the first path (502) will conduct only one half (either the positive or the negative) of the alternating current while the second path (504) will conduct the other half of the alternating current. In this embodiment, there is no mandate that a number of diodes in the first path (502) (or in other words, in the first set 602) should be unequal to the number of diodes in the second path (504) (or in other words, in the second set 604). Even in case the number of diodes in the first path (502) (or in other words, in the first set 602) is equal to the number of diodes in the second path (504) (or in other words, in the second set 604), because of the presence of the resistor (702), and using the resistor (702) thus present, it is possible to impart a first resistance value to the first path (502) and a second resistance value to the second path (504), wherein the first resistance value is unequal to second resistance value, thereby generating the coded driving current.

Figure 8:
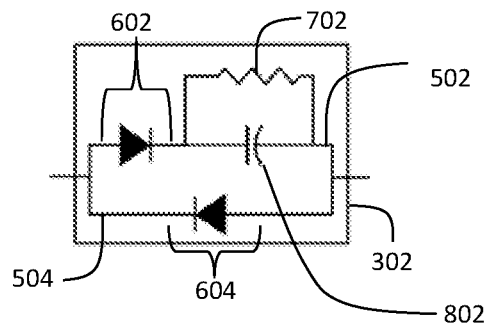
FIG. 8 illustrates block diagram of the DC coding circuit (302) wherein the first path (502) includes a first set of diodes (602) and the second path (504) includes a second set of diodes (604) and wherein the first path (502) is further provided with a capacitor (802) in accordance with an embodiment of the invention.

In one another embodiment, which is shown in FIG. 8, in one embodiment, the first path (502) includes a first set of diodes (602) and the second path (504) includes a second set of diodes (604). In an embodiment of the invention, one of the first or the second path is further provided with a combination of a resistor (702) and a capacitor (802) which are connected in parallel. The functioning of this embodiment is substantially similar to the one described in relation to FIG. 7 above in that using the resistor (702) and the capacitor (802), it is possible to impart a first resistance value to the first path (502) and a second resistance value to the second path (504), wherein the first resistance value is unequal to second resistance value, thereby generating the coded driving current. The difference between FIG. 7 and FIG. 8 is that use of capacitor (802) (whose impedance is a function of the AC frequency) provides dampening effect to sudden variations as well as holds charge proportional to the load current.

Figure 9:
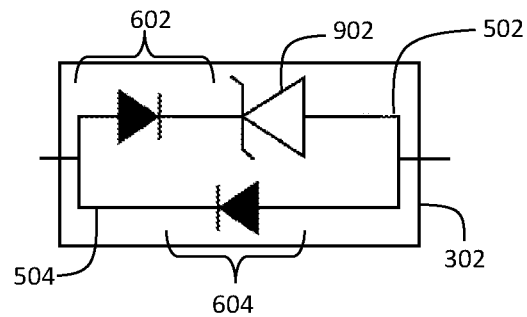
FIG. 9 illustrates block diagram of the DC coding circuit (302) wherein the first path (502) includes a first set of diodes (602) and the second path (504) includes a second set of diodes (604) and wherein the first path (502) is further provided with a Zener diode (902) in accordance with an embodiment of the invention.

In one another embodiment, which is shown in FIG. 9, in one embodiment, the first path (502) includes a first set of diodes (602) and the second path (504) includes a second set of diodes (604). In an embodiment of the invention, one of the first or the second path is further provided with at least one Zener diode (902). In this case, the connection of the Zener diode to a path is such that it is reversely polarized with respect to the diodes connected to the path. The functioning of this embodiment is substantially similar to the one described in relation to FIG. 7 above in that reliance can be placed on the Zener diode (902) to impart a first resistance value to the first path (502) and a second resistance value to the second path (504), wherein the first resistance value is unequal to second resistance value, thereby generating the coded driving current.

Thus, it may be said that in one embodiment, the first path includes a first set of diodes and the second path includes a second set of diodes, with a number of diodes in the first set being equal to a number of diodes in the second set, and one of the first or the second path is further provided with one or more resistors, one or more Zener diodes, one or more bi-polar capacitors, or combinations thereof.

In an alternative embodiment, the first path includes a first set of diodes and the second path includes a second set of diodes, a number of diodes in the first set and the second set are unequal, and one of the first or the second path is further provided with one or more resistors, one or more Zener diodes, one or more bi-polar capacitors, or combinations thereof.

It can be said that in the embodiments described in relation to FIGS. 5 to 9, the DC coding circuit (302) defines two electrical paths and forces the positive half cycle of the alternating current to flow through one path and forces the negative half cycle of the alternating current to flow through the other path. In an alternative embodiment, the DC coding circuit (302) may define a first path (502) for conducting one half cycle of the alternating current and a second path (504) for conducting both half cycles of the alternating current. The first path (502) is arranged so as to be parallel to the second path (504). In this embodiment, the first path is having a first resistance value and the second path is having the second resistance value. In an embodiment of the invention, the first resistance value and the second resistance value are unequal.

Assuming that the first path (502) is configured to merely conduct positive half cycles of the alternating current and that the second path is configured to conduct both (positive as well as negative) half cycles of the alternating current, it can be seen that the DC coding circuit (302) imparts a first resistance value while conducting the positive half cycle of the alternating current and a second resistance value while conducting the negative half cycle of the alternating current, thereby generating coded driving current. This embodiment is described in detail in the following paragraphs.

Figure 10:
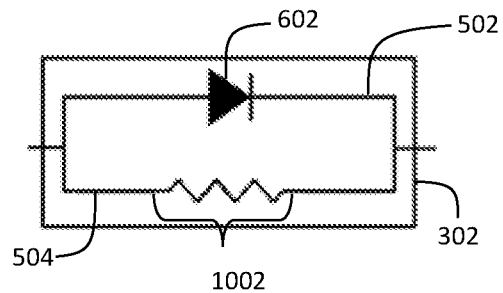
FIG. 10 illustrates block diagram of the DC coding circuit (302) wherein the first path (502) includes a first set of diodes (602) and the second path (504) includes one or more resistors (1002) in accordance with an embodiment of the invention.
Figure 11:
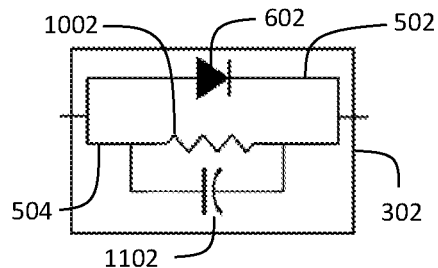
FIG. 11 illustrates block diagram of the DC coding circuit (302) wherein the first path (502) includes a first set of diodes (602) and the second path (504) includes one or more capacitors (1102) in accordance with an embodiment of the invention.
Figure 12:
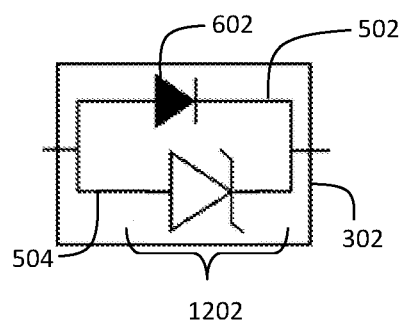
FIG. 12 illustrates block diagram of the DC coding circuit (302) wherein the first path (502) includes a first set of diodes (602) and the second path (504) includes one or more Zener diode (1202) in accordance with an embodiment of the invention.

Referring particularly to FIG. 10, in an embodiment, the first path (502) includes a first set of diodes (602) and the second path (504) includes one or more resistors (1002). Referring particularly to FIG. 11, in another embodiment, the first path (502) includes a first set of diodes (602) and the second path (504) includes one or more capacitors (1102) that are connected in parallel with resistor (1002). Referring particularly to FIG. 12, in another embodiment, the first path (502) includes a first set of diodes (602) and the second path (504) includes one or more Zener diode (1202). In all the above described cases, the first set of diodes (602) may comprise "x" number of diodes, wherein x≥1.

Thus, it can be said that the first path includes a first set of diodes imparting a first resistance value and the second path includes one or more resistors, one or more Zener diodes, one or more bi-polar capacitors, or combinations thereof imparting a second resistance value.

Figure 13:
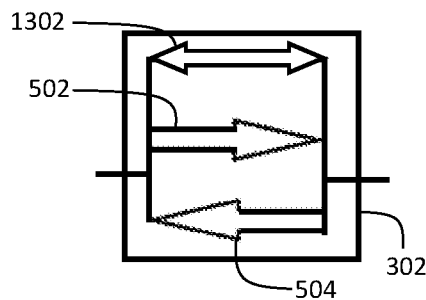
FIG. 13 illustrates block diagram of the DC coding circuit (302) having the alternative path (1302) in accordance with an embodiment of the invention.

Now referring to FIG. 13, in an embodiment of the invention, the DC coding circuit (302) defines a first path (502) for conducting a positive half cycle of the alternating current, a second path (504) for conducting a negative half cycle of the alternating current, and at least one alternative path (1302). The first path is arranged so as to be parallel to the second path (504).

The first path is having a first resistance value and the second path is having a second resistance value, the first and the second resistance values being unequal. In an embodiment of the invention, the alternative path provides an alternative route for current to flow in an event of open circuit failure of the first and/or the second path. By way of a non-limiting example, the alternative path is provided in parallel with the first path and the second path and is always in a conducting state. In the following paragraphs, a more elaborate description of this embodiment is being provided.

Figure 14:
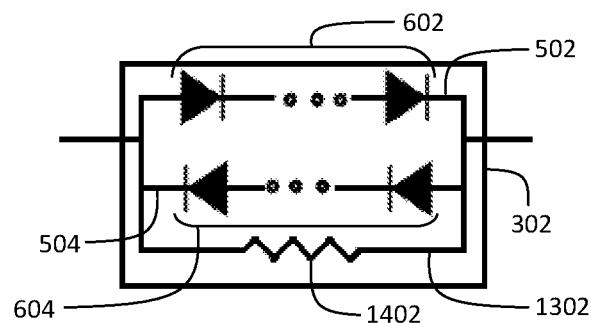
FIG. 14 illustrates block diagram of the DC coding circuit (302) wherein the alternative path (1302) comprises at least one resistor (1402) in accordance with an embodiment of the invention.

Referring particularly to FIG. 14, in an embodiment, the first path (502) includes a first set of diodes (602) and the second path (504) includes a second set of diodes (604). A number of diodes in the first set (602) is unequal to a number of diodes in the second set (604). The alternative path (1032) includes one or more resistors (1402).

Figure 15:
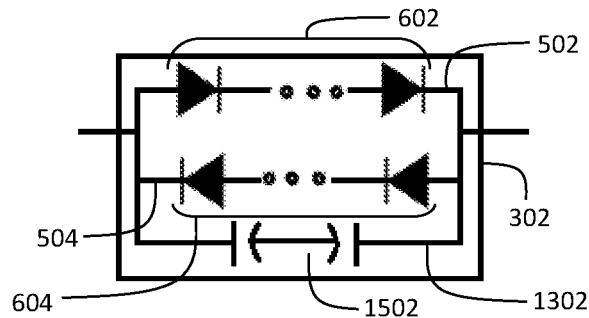
FIG. 15 illustrates block diagram of the DC coding circuit (302) wherein the alternative path (1302) comprises at least one bi-polar capacitor (1502) in accordance with an embodiment of the invention.

Referring particularly to FIG. 15, in an embodiment, the first path (502) includes a first set of diodes (602) and the second path (504) includes a second set of diodes (604). A number of diodes in the first set (602) is unequal to a number of diodes in the second set (604). The alternative path (1032) includes one or more bi-polar capacitors (1502).

Figure 16:
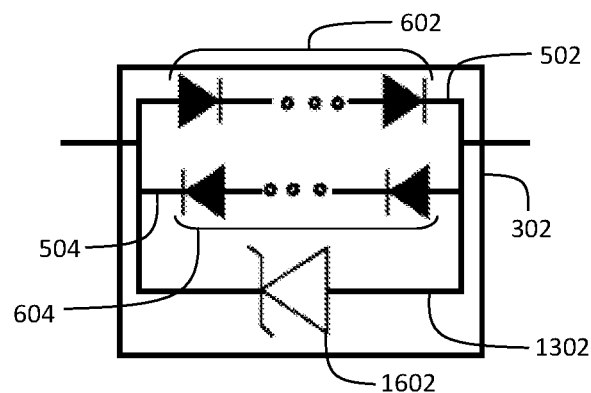
FIG. 16 illustrates block diagram of the DC coding circuit (302) wherein the alternative path (1302) comprises at least one Zener diode (1602) in accordance with an embodiment of the invention.

Referring particularly to FIG. 16, in an embodiment, the first path (502) includes a first set of diodes (602) and the second path (504) includes a second set of diodes (604). A number of diodes in the first set (602) is unequal to a number of diodes in the second set (604). The alternative path (1032) includes one or more Zener diode (1602).

In the embodiment illustrated in FIGS. 14 to 16, the alternative path is provided so as to be parallel to the first and the second paths.

Figure 17:
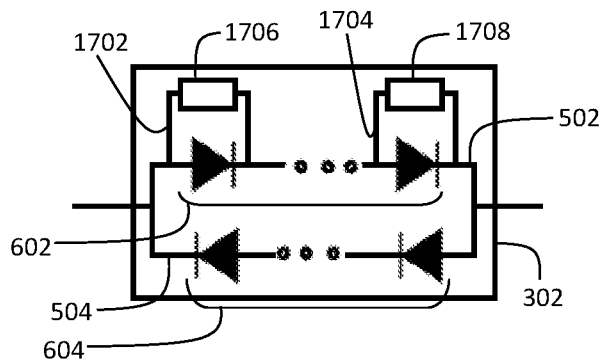
FIG. 17 illustrates block diagram of the DC coding circuit (302) wherein the alternative path is provided in parallel across individual diodes forming part of the first in accordance with an embodiment of the invention.

In an alternative embodiment, the alternative path may be provided in parallel across individual diodes forming part of the first and/or the second paths and is always in conducting state. A non-limiting example of this embodiment is shown in FIG. 17, wherein the first path (502) is shown to include a first set of diodes (602) and the second path (504) is shown to include a second set of diodes (604). As can be seen, a first alternative path (1702) is provided so as to be parallel with regard to first diode forming part of the first path and a further alternative path (1704) is provided so as to be parallel with regard to further diode forming part of the first path. The first alternative path (1702) is provided with at least one of a resistor or a capacitor or a combination thereof (1706). The second alternative path (1704) is provided with at least one of a resistor or a capacitor or a combination thereof (1708).

While in the paragraphs above, a detailed note on the source device (108) has been provided, hereinafter a detailed note on the load device (110) is being provided.

Figure 18:
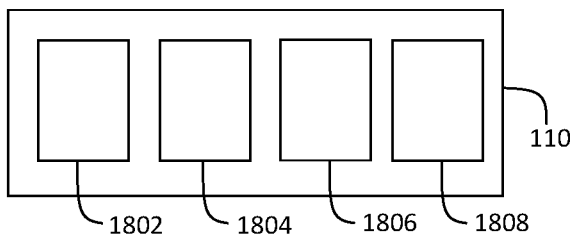
FIG. 18 illustrates block diagram of the load device (110) in accordance with an embodiment of the invention.

Now referring to FIG. 18, there is illustrated a detailed block diagram of the load device (110) in accordance with an embodiment of the invention. In an embodiment of the invention, the load device (110) comprises a first set of ports (1802) adapted to receive coded driving current. The load device (110) further comprises a decoding circuit (1804) operably connected to the first set of ports (1802). The decoding circuit (1804) is adapted to decode the coded driving current and to produce a control command. The load device (110) furthermore comprises a control unit (1806) adapted to receive the control command from the decoding circuit and controlling at least one working state of an electrical load (1808) based on the control command.

It may be noted that the electrical load (1808), the control unit (1806) and the first set of ports (1802) may be of traditional type and hence, these items are not being described further.

Since the load device (110) works in conjunction with the source device (108), in an embodiment of the invention the coded driving current comprises an alternating current including positive half cycles and negative half-cycles, wherein the positive half cycles are offset by a first voltage offset level, the negative half cycles are offset by a second voltage offset level, the first and the second voltage offset levels being unequal. It may be therefore, said that the first voltage offset level is associated with a first resistance value and the second voltage offset level is associated with a second resistance value.

The construction of the decoding circuit (1804) that forms part of the load device may be substantially similar to the decoding circuit (206) that forms part of the source device (108). Hence, the description of the decoding circuit (1084) forming part of the load device (1800) being provided hereinafter also pertains to the decoding circuit (206) that forms part of the source device (108).

While in FIG. 18, the decoding circuit (1804) is shown as being connected to the first set of ports so as to be in series with the electrical load (1808), in an alternative embodiment, the decoding circuit (1804) may be connected to the first set of ports so as to be in parallel with the electrical load (1808). Now referring to FIG. 19, when the decoding circuit (1804) is connected to the first set of ports so as to be in parallel with the electrical load (1808), the decoding circuit comprises a series combination of a resistor (1902) and a bipolar capacitor (1904). On the other hand, when the decoding circuit is connected to the first set of ports so as to be in series with the electrical load (1808), as shown in FIG. 20, the decoding circuit comprises a parallel combination of a resistor (2002) and a bipolar capacitor (2004).

Figure 21:
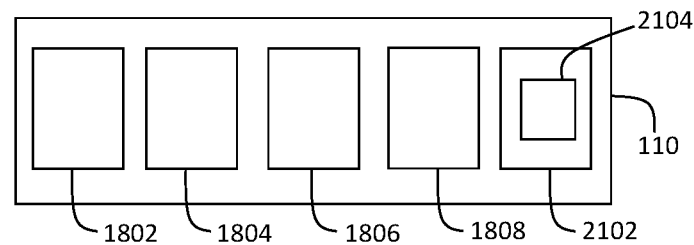
FIG. 21 illustrates block diagram of the load device (110) which is further provided with a feedback signal generating unit (2012) that comprises a DC coding circuit (2104) in accordance with an embodiment of the invention.

In an embodiment of the invention, as shown in FIG. 21, the electrical load (1808) is operably connected to a feedback signal generating unit (2012). In the embodiment of the invention, the feedback signal generating unit (2102) may be adapted to produce a coded feedback signal by imparting a third resistance value while conducting a positive half cycle of the alternating current and a fourth resistance value while conducting a negative half cycle of the alternating current, the third and the fourth resistance values being unequal. By way of an example, the feedback signal generating unit (2102) may comprise a DC coding circuit (2104).

Figure 22:
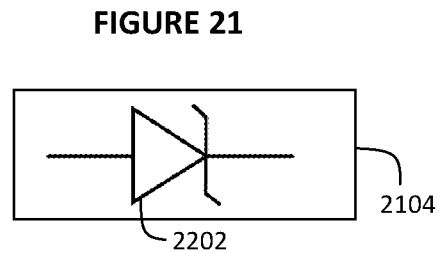
FIG. 22 illustrates a DC coding circuit (2104) that comprises a Zener diode (2202) which is connected in series between the AC supply means and the electrical load (1808) in accordance with an embodiment of the invention.

Now referring to FIG. 22, in an embodiment of the invention, the DC coding circuit (2104) may comprise a Zener diode (2202) which is connected so as to be connected downstream of and in series with the electrical load (1808).

Figure 23:
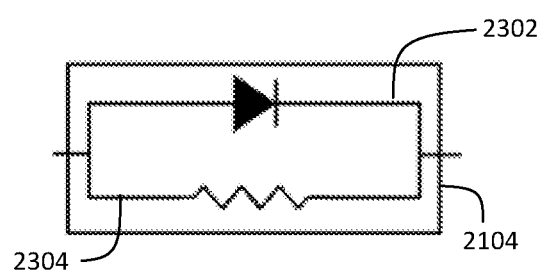
FIG. 23 illustrates a DC coding circuit (2104) that defines a first path (2302) for conducting a first half cycle of the alternating current and a second path (2304) for conducting a both half cycles of the alternating current in accordance with an embodiment of the invention.

Referring to FIG. 23, in an embodiment of the invention, the DC coding circuit (2104) defines a first path (2302) for conducting a first half cycle of the alternating current and a second path (2304) for conducting a both half cycle of the alternating current, the first path (2302) being parallel to the second path (2304), the first path (2302) having the third resistance value and the second path having the fourth resistance value, the third and the fourth resistance values being unequal.

Figure 24:
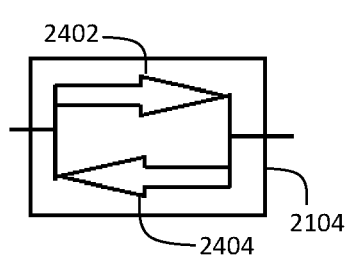
FIG. 24 illustrates a DC coding circuit (2104) that defines a first path (2402) for conducting a positive half cycle of the alternating current and a second path (2404) for conducting a negative half cycle of the alternating current in accordance with an embodiment of the invention.

Referring to FIG. 24, in an embodiment of the invention, the DC coding circuit (2104) defines a first path (2402) for conducting a positive half cycle of the alternating current and a second path (2404) for conducting a negative half cycle of the alternating current, the first path (2402) being parallel to the second path (2404), the first path (2402) having the third resistance value and the second path (2404) having the fourth resistance value, the third and the fourth resistance values being unequal.

Figure 25:
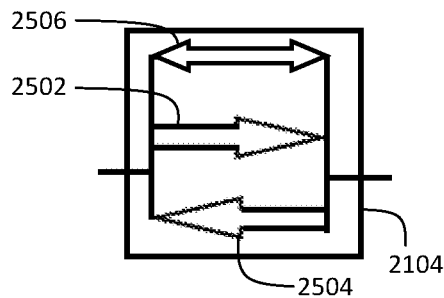
FIG. 25 illustrates a DC coding circuit (2104) that defines a first path (2502) for conducting a positive half cycle of the alternating current, a second path (2504) for conducting a negative half cycle of the alternating current, and at least one alternative path (2506) in accordance with an embodiment of the invention.

Referring to FIG. 25, in an embodiment of the invention, the DC coding circuit (2104) defines a first path (2502) for conducting a positive half cycle of the alternating current, a second path (2504) for conducting a negative half cycle of the alternating current, and at least one alternative path (2506), the first path (2502) being parallel to the second path (2504), the first path (2502) having the third resistance value and the second path (2504) having the fourth resistance value, the third and the fourth resistance values being unequal, and the alternative path (2506) is provided in parallel with the first path (2502) and the second path (2504) and is always in a conducting state. The alternative path (2506) provides an alternative route for current to flow in an event of open circuit failure of the first and/or the second path.

While in FIGS. 22 to 25, the DC coding circuit (2104) forming part of the load device has been described briefly, it may be noted that the DC coding circuit (2104) forming part of the load device may be substantially similar to the DC coding circuit (302) which forms part of the source device (108) and which has been described in detail with reference to FIGS. 4 to 17. Hence, reference may be made to FIGS. 4 to 17 and their description as provided above for some of the specific constructions of the DC coding circuit (2104).

Figure 26:
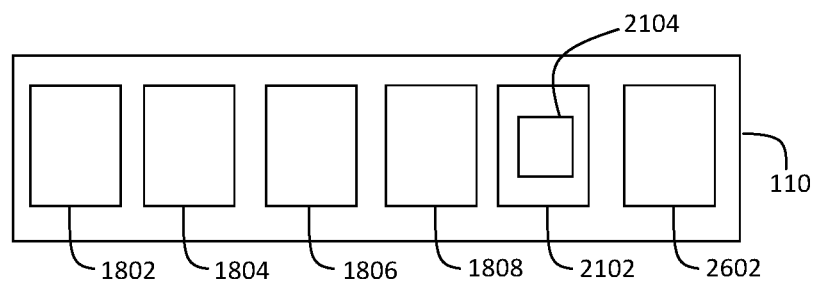
FIG. 26 illustrates construction of the load device (110) comprising a sensing unit (2602) in accordance with an embodiment of the invention.

As shown in FIG. 26, in an embodiment of the invention, the electrical load (1808) may be operably connected to a sensing unit (2602) for generating at least one sensed signal corresponding to the working state of the electrical load (1808) and transmit the same. The sensing unit (1808) may be of a traditional type and hence, further details in relation to the same are not being provided.

While the load device (110) described above works in conjunction with the source device (108) that provides coded driving current, it is possible to construct an alternative load device (110') in such a manner that it provides feedback signals using the concept of DC encoding of AC driven systems but does not necessarily need receive coded driving current (but rather receives normal AC current) from the source device (108) for its functioning.

Figure 27:
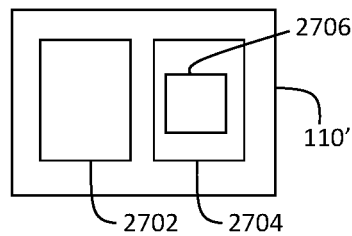
FIG. 27 illustrates construction of an alternative load device (110') that comprises a electrical load (2702) and a feedback signal generating unit (2704) that comprises a DC coding unit (2706) in accordance with an embodiment of the invention.

Now referring to FIG. 27, construction of the alternative load device (110') is shown and includes an electrical load (2702) configured to receive an alternating current; and a feedback signal generating unit (2704) for generating coded feedback signal. The feedback signal generating unit (2704) comprises a DC coding circuit (2706). The DC coding circuit (2706) is adapted to receive the alternating current. Further, the DC coding circuit (2706) is adapted to impart a first resistance value while conducting a positive half cycle of the alternating current and a second resistance value while conducting a negative half cycle of the alternating current to thereby generating the coded feedback signal, the first and the second resistance values being unequal.

Figure 28:
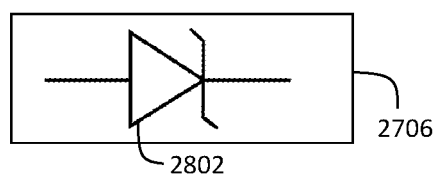
FIG. 28 illustrates a DC coding circuit (2706) that comprises a Zener diode (2802) which is connected in series between the AC supply means and the electrical load (2702) in accordance with an embodiment of the invention.

Now referring to FIG. 28, in an embodiment of the invention, the DC coding circuit (2706) comprises a Zener diode (2802) which is connected in series between the AC supply means and the electrical load (2702).

Figure 29:
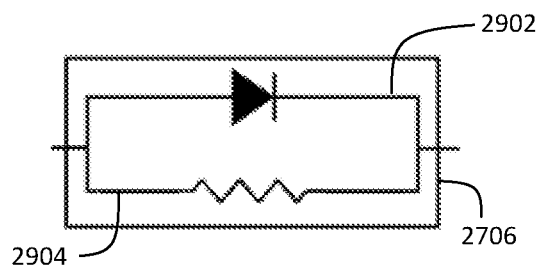
FIG. 29 illustrates a DC coding circuit (2706) that defines a first path (2902) for conducting a first half cycle of the alternating current and a second path (2904) for conducting a both half cycles of the alternating current in accordance with an embodiment of the invention.

Now referring to FIG. 29, in another embodiment of the invention, the DC coding circuit (2706) defines a first path (2902) for conducting a first half cycle of the alternating current and a second path (2904) for conducting a both half cycle of the alternating current, the first path (2902) being parallel to the second path (2904), the first path (2902) having the first resistance value and the second path (2904) having the second resistance value, the first and the second resistance values being unequal.

Figure 30:
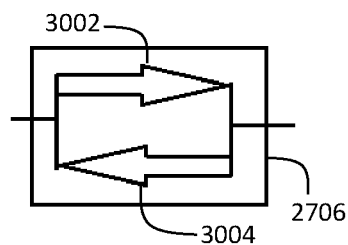
FIG. 30 illustrates a DC coding circuit (2706) that defines a first path (3002) for conducting a positive half cycle of the alternating current and a second path (3004) for conducting a negative half cycle of the alternating current in accordance with an embodiment of the invention.

Now referring to FIG. 30, in another embodiment of the invention, the DC coding circuit (2706) defines a first path (3002) for conducting a positive half cycle of the alternating current and a second path (3004) for conducting a negative half cycle of the alternating current, the first path (3002) being parallel to the second path (3004), the first path (3002) having the first resistance value and the second path (3004) having the second resistance value, the first and the second resistance values being unequal.

Figure 31:
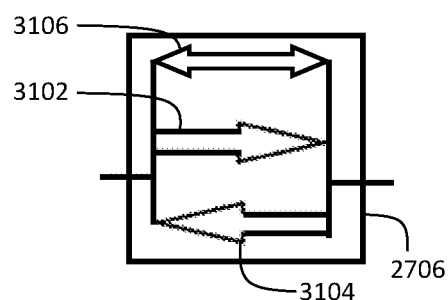
FIG. 31 illustrates a DC coding circuit (2706) that defines a first path (3102) for conducting a positive half cycle of the alternating current, a second path (3104) for conducting a negative half cycle of the alternating current, and at least one alternative path (3106) in accordance with an embodiment of the invention.

Now referring to FIG. 31, in another embodiment of the invention, the DC coding circuit (2706) defines a first path (3102) for conducting a positive half cycle of the alternating current, a second path (3104) for conducting a negative half cycle of the alternating current, and at least one alternative path (3106), the first path (3102) being parallel to the second path (3104), the first path (3102) having the first resistance value and the second path (3104) having the second resistance value, the first and the second resistance values being unequal, and the alternative path (3106) is provided in parallel with the first path (3102) and the second path (3104) and is always in a conducting state, the alternative path (3106) provides an alternative route for current to flow in an event of open circuit failure of the first and/or the second path.

While in FIGS. 28 to 31, the DC coding circuit (2706) forming part of the alternative load device (110') has been described briefly, it may be noted that the DC coding circuit (2706) forming part of the alternative load device (110') may be substantially similar to the DC coding circuit (302) which forms part of the source device (108) and which has been described in detail with reference to FIGS. 4 to 17. Hence, reference may be made to FIGS. 4 to 17 and their description as provided above for some of the specific constructions of the DC coding circuit (2706).

Figure 32:
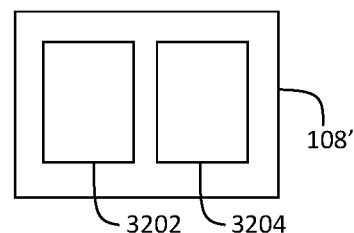
FIG. 32 illustrates block diagram of an alternative source device (108') that comprises a decoding circuit operably connected to the input port for decoding the coded feedback signal in accordance with an embodiment of the invention.

Since in one embodiment as illustrated in FIGS. 27 to 31, the alternative load device (110') provides feedback signals using the concept of DC encoding of AC driven systems despite receiving normal AC current from the source device (108), in one embodiment of the invention, there may be provided an alternative source device (108'), as shown in FIG. 32, that comprises an input port (3202) for receiving a coded feedback signal; and a decoding circuit (3204) operably connected to the input port (3202) and being adapted to decode the coded feedback signal. In an embodiment of the invention, the coded feedback signal comprises an alternating current including positive half cycles and negative half-cycles, wherein the positive half cycles are offset by a first voltage offset level, the negative half cycles are offset by a second voltage offset level, the first and the second voltage offset levels being unequal.

Figure 19:
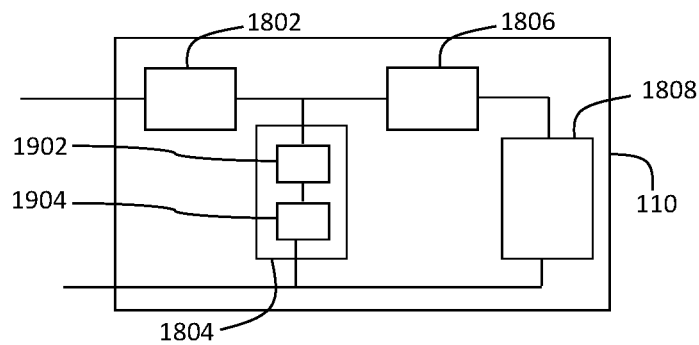
FIG. 19 illustrates block diagram of the load device (110) wherein the decoding circuit (1804) is connected to the first set of ports so as to be in parallel with the electrical load (1808) in accordance with an embodiment of the invention.
Figure 20:
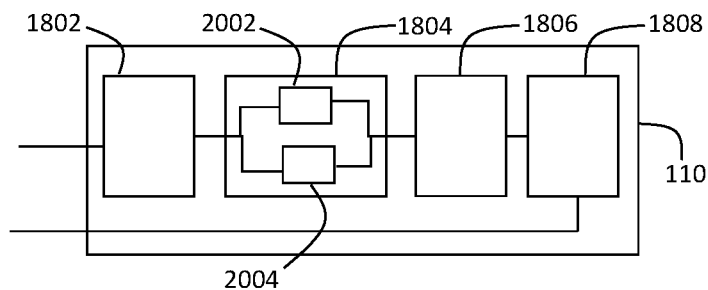
FIG. 20 illustrates block diagram of the load device (110) wherein the decoding circuit (1804) is connected to the first set of ports so as to be in series with the electrical load (1808) in accordance with an embodiment of the invention.

In an embodiment of the invention, the decoding circuit (3204) that forms part of the alternative source device (108') may be substantially similar to the decoding circuit (1084) forming part of the load device (1800), which has been described in detailed above with reference to FIGS. 18 to 20. Thus, reference may be made to FIGS. 18 to 20 and the description provided above in relation to the same to understand the construction of the decoding circuit (3204) that forms part of the alternative source device (108').

It may be noted that to increase operational reliability, redundant elements may be connected either in series or in parallel with the elements already present. By way of example, connecting two diodes in series increase the reliability of the device in short-circuit type failure. By way of another example, connecting two diodes in parallel increases the reliability of the device in open-circuit type failure.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processing may be changed and are not limited to the manner described herein. In addition, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

While certain present preferred embodiments of the invention have been illustrated and described herein, it is to be understood that the invention is not limited thereto, but may be otherwise variously embodied and practiced within the scope of the following claims.

We claim:

1. A device for providing an AC power to at least one load, comprising:
   an input port for receiving an alternating current; and
   a power supply connection mechanism operably connected to the input port and configured to generate coded driving current, the power supply connection mechanism comprising a DC coding circuit connected in series between the AC supply means and the load, the DC coding circuit imparting a first resistance value while conducting a positive half cycle of the alternating current and a second resistance value while conducting a negative half cycle of the alternating current to thereby generate coded driving current, the first and the second resistance values being unequal.

2. The device as claimed in claim 1, wherein imparting the first resistance value while conducting the positive half cycle of the alternating current and imparting the second resistance value while conducting the negative half cycle of the alternating current results in generation of positive half cycles having a first voltage offset level and negative half-cycles having a second voltage offset level.

3. The device as claimed in claim 1, wherein the DC coding circuit comprises a Zener diode which is connected in series between the AC supply means and the load.

4. The device as claimed in claim 1, wherein the DC coding circuit defines a first path for conducting a first half cycle of the alternating current and a second path for conducting a both half cycle of the alternating current, the first path being parallel to the second path, the first path having the first resistance value and the second path having the second resistance value, the first and the second resistance values being unequal.

5. The device as claimed in claim 1, wherein the DC coding circuit defines a first path for conducting a positive half cycle of the alternating current and a second path for conducting a negative half cycle of the alternating current, the first path being parallel to the second path, the first path having the first resistance value and the second path having the second resistance value, the first and the second resistance values being unequal.

6. The device as claimed in claim 1, wherein the DC coding circuit defines a first path for conducting a positive half cycle of the alternating current, a second path for conducting a negative half cycle of the alternating current, and at least one alternative path, the first path being parallel to the second path, the first path having the first resistance value and the second path having the second resistance value, the first and the second resistance values being unequal.

7. The device as claimed in claim 1, wherein the power supply connection mechanism further comprises a current sensing and validation unit connected so as to be downstream of the DC coding circuit.

8. The device as claimed in claim 1, wherein the device comprises a decoding circuit adapted to receive a coded feedback signal from said at least one load and decode the same.

9. A load device comprising:
a first set of ports adapted to receive coded driving current;
a decoding circuit operably connected to the first set of ports and being adapted to decode the coded driving current and to produce a control command; and
a control unit adapted to receive the control command from the decoding circuit and controlling at least one working state of an electrical load based on the control command; and
wherein the coded driving current comprises an alternating current including positive half cycles and negative half-cycles, wherein the positive half cycles are offset by a first voltage offset level, the negative half cycles are offset by a second voltage offset level, the first and the second voltage offset levels being unequal.

10. The load device as claimed in claim 9, wherein the first voltage offset level is associated with a first resistance value and the second voltage offset level is associated with a second resistance value.

11. The load device as claimed in claim 9, wherein the decoding circuit is connected to the first set of ports so as to be in parallel with the load.

12. The load device as claimed in claim 9, wherein the decoding circuit is connected to the first set of ports so as to be in series with the load.

13. The load device as claimed in claim 9, wherein the load is operably connected to a feedback signal generating unit, the feedback signal generating unit being adapted to produce a coded feedback signal by imparting a third resistance value while conducting a positive half cycle of the alternating current and a fourth resistance value while conducting a negative half cycle of the alternating current, the third and the fourth resistance values being unequal.

14. The load device as claimed in claim 9, wherein the load is operably connected to a sensing unit for generating at least one sensed signal corresponding to the working state of the electrical load and transmit the same.

15. A load device comprising:
an electrical load configured to receive an alternating current; and
a feedback signal generating unit for generating a coded feedback signal, the feedback signal generating unit comprising a DC coding unit adapted to produce a coded feedback signal by imparting a third resistance value while conducting a positive half cycle of the alternating current and a fourth resistance value while conducting a negative half cycle of the alternating current, the third and the fourth resistance values being unequal.

16. The load device as claimed in claim 15, wherein the DC coding circuit comprises a Zener diode which is connected in series between the AC supply means and the load.

17. The load device as claimed in claim 15, wherein the DC coding circuit defines a first path for conducting a first half cycle of the alternating current and a second path for conducting a both half cycle of the alternating current, the first path being parallel to the second path, the first path having the first resistance value and the second path having the second resistance value, the first and the second resistance values being unequal.

18. The load device as claimed in claim 15, wherein the DC coding circuit defines a first path for conducting a positive half cycle of the alternating current and a second path for conducting a negative half cycle of the alternating current, the first path being parallel to the second path, the first path having the first resistance value and the second path having the second resistance value, the first and the second resistance values being unequal.

19. The load device as claimed in claim 15, wherein the DC coding circuit defines a first path for conducting a positive half cycle of the alternating current, a second path for conducting a negative half cycle of the alternating current, and at least one alternative path, the first path being parallel to the second path, the first path having the first resistance value and the second path having the second resistance value, the first and the second resistance values being unequal, and the alternative path is provided in parallel with the first path and the second path and is always in a conducting state, the alternative path provides an alternative route for current to flow in an event of open circuit failure of the first and/or the second path.

20. A source device being in operational communication with the load device as claimed in claim 15, said source device comprising:
an input port for receiving a coded feedback signal;
a decoding circuit operably connected to the input ports and being adapted to decode the coded feedback signal;
wherein the coded feedback signal comprises an alternating current including positive half cycles and negative half-cycles, wherein the positive half cycles are offset by a first voltage offset level, the negative half cycles are offset by a second voltage offset level, the first and the second voltage offset levels being unequal.

* * * * *